(12) United States Patent
Tsukuda et al.

(10) Patent No.: US 7,474,604 B2
(45) Date of Patent: Jan. 6, 2009

(54) ELECTRON BEAM RECORDER, ELECTRON BEAM IRRADIATION POSITION DETECTING METHOD AND ELECTRON BEAM IRRADIATION POSITION CONTROLLING METHOD

(75) Inventors: Masahiko Tsukuda, Katano (JP); Shinya Abe, Kadoma (JP)

(73) Assignee: Panasonic Corporation, Osaka (JP)

( * ) Notice: Subject to any disclaimer, the term of this patent is extended or adjusted under 35 U.S.C. 154(b) by 726 days.

(21) Appl. No.: 11/076,787

(22) Filed: Mar. 10, 2005

(65) Prior Publication Data

US 2005/0232114 A1 Oct. 20, 2005

(30) Foreign Application Priority Data

Mar. 15, 2004 (JP) ............................ P2004-072546

(51) Int. Cl.
*G11B 7/00* (2006.01)
(52) U.S. Cl. ..................................................... 369/126
(58) Field of Classification Search ................. 369/101, 369/126, 103, 44.23
See application file for complete search history.

(56) References Cited

U.S. PATENT DOCUMENTS 5,270,990 A 12/1993 Mizasawa et al.

7,359,305 B2 * 4/2008 Tsukuda et al. ............. 369/101
2004/0166426 A1 8/2004 Tsukuda et al.

FOREIGN PATENT DOCUMENTS

DE 1 439 900 A1 12/1968
JP 2002-141012 5/2002

OTHER PUBLICATIONS

European Search Report for Application No. EP 05 00 5088 dated Sep. 11, 2008.

* cited by examiner

*Primary Examiner*—Nabil Z Hindi
(74) *Attorney, Agent, or Firm*—RatnerPrestia

(57) ABSTRACT

An electron beam recorder includes an electron optical system for irradiating the electron beam on a master of an information recording medium and a shielding plate for shielding the electron beam. An electron beam irradiation quantity detector is provided on the shielding plate and is divided into first and second electron beam detecting portions along an information recording direction on the master. A difference detector calculates a difference between a first quantity of the electron beam irradiated on the first electron beam detecting portion and a second quantity of the electron beam irradiated on the second electron beam detecting portion such that a position of the electron beam in a direction substantially perpendicular to the information recording direction is detected from the difference.

14 Claims, 7 Drawing Sheets

ELECTRON BEAM RECORDER, ELECTRON BEAM IRRADIATION POSITION DETECTING METHOD AND ELECTRON BEAM IRRADIATION POSITION CONTROLLING METHOD

BACKGROUND OF THE INVENTION

1. Field of the Invention

The present invention generally relates to electron beam recorders, electron beam irradiation position detecting methods and electron beam irradiation position controlling methods and more particularly, to an electron beam recorder, an electron beam irradiation detecting method and an electron beam irradiation position controlling method, in which signals are spirally recorded on a master of an information recording medium such as an optical disc highly accurately.

2. Description of the Prior Art

In general, manufacture of an optical disc includes a step in which by using an optical disc master recorder employing a laser or an electron beam as a light source, a master coated with photoresist is exposed and developed such that an optical disc master formed, on its surface, with concave and convex patterns such as information pits and grooves is produced, a step of producing a metallic die which has the concave and convex patterns transferred thereto from the optical disc master and is called a "stamper", a step of producing a resinous molded substrate by using the stamper and a step in which a recording film, a reflective film, etc. are formed on the molded substrate.

An electron beam recorder used for exposure at the time an optical disc master is produced by using an electron beam is generally arranged as follows. FIG. 7 shows an arrangement of a conventional electron beam recorder. The conventional electron beam recorder includes an electron beam source 601 for generating an electron beam 614 and an electron optical system 602 which converges the emitted electron beam 614 onto a resist master 609 so as to record information patterns on the resist master 609 in accordance with inputted information signals. The electron beam source 601 and the electron optical system 602 are accommodated in a vacuum chamber 613.

The electron beam source 601 is constituted by a filament for emitting electrons upon flow of electric current therethrough, an electrode for suppressing the emitted electrons, an electrode for extracting and accelerating the electron beam 614, etc. and is adapted to emit the electrons from one point.

Meanwhile, the electron optical system 602 includes a lens 603 for converging the electron beam 614, an aperture 604 for determining a beam diameter of the electron beam 614, a pair of first deflection electrodes 605 and a pair of second deflection electrodes 606 which deflect the electron beam 614 in orthogonal directions, respectively in accordance with the inputted information signals, a shielding plate 607 for shielding the electron beam 614 bent by the first deflection electrodes 605 and a lens 608 for converging the electron beam 614 onto a surface of the resist master 609.

Furthermore, the resist master 609 is held on a rotary stage 610 and is moved horizontally together with the rotary stage 610 in the direction of the arrow by a horizontally traveling stage 611. If the master 609 is moved horizontally by the horizontally traveling stage 611 while being rotated by the rotary stage 610, the electron beam 614 can be irradiated spirally on the master 609 so as to spirally record the information signals of the optical disc on the master 609.

In addition, a focusing grid 612 is disposed substantially flush with the surface of the master 609. This focusing grid 612 is provided for adjusting a focal position of the lens 608 such that the lens 608 converges the electron beam 614 onto the surface of the master 609. If electrons reflected by the focusing grid 612 or secondary electrons emitted from the focusing grid 612 upon irradiation of the electron beam 614 on the focusing grid 612 are detected by a detector such that a grid image is monitored, the focal position of the lens 608 can be adjusted from a state in which the grid image is seen. The members 609-612 referred to above are also accommodated in the vacuum chamber 613.

The first deflection electrodes 605 are provided for bending the electron beam in a direction substantially perpendicular to a travel direction of the horizontally traveling stage 611. Since the first deflection electrodes 605 bend the electron beam 614 towards the shielding plate 607 in accordance with signals inputted to the first deflection electrodes 605, the first deflection electrodes 605 are capable of selecting whether or not the electron beam 614 is irradiated on the master 609 such that information pit patterns, etc. can be recorded on the master 609.

Meanwhile, the second deflection electrodes 606 are provided for bending the electron beam 614 in a direction substantially perpendicular to that of the first deflection electrodes 605, namely, in the substantially same direction as the travel direction of the horizontally traveling stage 611 and is capable of bending the electron beam 614 in the substantially same direction as the travel direction of the horizontally traveling stage 611 in accordance with signals inputted to the second deflection electrodes 606. The travel direction of the horizontally traveling stage 611 corresponds to a radial direction of the master 609 to be recorded. Variations of a track pitch of the optical disc, etc. can be corrected by the signals inputted to the second deflection electrodes 606.

In the optical disc, since the track pitch of information signal pits to be recorded is required to be recorded highly accurately, travel amount of the horizontally traveling stage 611, nonrepeatable runout of the rotary stage 610 or variations of irradiation position of the electron beam 614 should be controlled with high precision. As disclosed in, for example, Japanese Patent Laid-Open Publication No. 2002-141012, error of the travel amount of the horizontally traveling stage 611 or the like can be detected by laser measurement, etc. so as to be eliminated by driving the second deflection electrodes 606.

In the conventional electron beam recorder, even if mechanical accuracies such as the travel amount of the horizontally traveling stage 611 and the nonrepeatable runout of the rotary stage 610 can be corrected, position of the electron beam 614 itself is most likely to vary and thus, it is of vital importance to correct variations of the position of the electron beam 614. The variations of the position of the electron beam 614 are caused by a phenomenon in which the electron beam 614 undergoes great influences such as variations of magnetic field around the recorder as well as mechanical vibrations, acoustic noise and electrical noise of the recorder.

Generally, since the electron beam source 601 and the electron optical system 602 are accommodated in the vacuum chamber 613, it is quite difficult to detect in the vacuum chamber 613 the variations of the position of the electron beam 614 subjected to acceleration and convergence. Meanwhile, a method may be considered in which the electron beam 614 used for recording is irradiated on a detection object other than the master 609, for example, the focusing grid 612 and variations of irradiation position of the electron beam 614 on the detection object are detected by using signals of a detector for detecting an image formed on the detection object. However, this method is not applicable when signals are being recorded on the master 609. Therefore, even in this method, it is extremely difficult to detect and correct the variations of the position of the electron beam 614 when the signals are being recorded on the master.

SUMMARY OF THE INVENTION

Accordingly, with a view to eliminating the above mentioned drawbacks of prior art, an essential object of the present invention is to raise accuracy of a track pitch of an information recording medium by detecting and correcting variations of irradiation position of an electron beam during recording on a master of the information recording medium.

To this end, the present invention proposes, by utilizing a phenomenon that in case information signals such as pits are recorded on a master by an electron beam, the electron beam is bent by a pair of first deflection electrodes and is shielded by a shielding plate, an electron beam recorder in which a position of the electron beam in a radial direction of the master, i.e., in a travel direction of a horizontally traveling stage is determined from a difference signal between first and second quantities of the electron beam irradiated, respectively, on first and second electron beam detecting portions of an electron beam irradiation quantity detector on the shielding plate such that even during recording on the master by the use of the electron beam, not only irradiation position of the electron beam can be detected but positional variations of the electron beam can be corrected highly accurately.

In order to accomplish this end, the electron beam recorder of the present invention includes an electron optical system for irradiating the electron beam on a master of an information recording medium and a shielding plate for shielding the electron beam. An electron beam irradiation quantity detector is provided on the shielding plate and is divided into first and second electron beam detecting portions along an information recording direction on the master. A difference detector calculates a difference between a first quantity of the electron beam irradiated on the first electron beam detecting portion and a second quantity of the electron beam irradiated on the second electron beam detecting portion such that a position of the electron beam in a direction substantially perpendicular to the information recording direction is detected from the difference.

In accordance with the present invention, when pits or the like are recorded on the master by the electron beam, variations of irradiation position of the electron beam shielded by the shielding plate are detected by using the two electron beam detecting portions of the electron beam irradiation quantity detector provided on the shielding plate, so that the variations of the irradiation position of the electron beam can be detected while the electron beam for recording patterns on the master is being irradiated on the master. Thus, during recording on the master, it is possible to judge whether or not variations of the track pitch recorded on the master falls within a permissible range. Meanwhile, by driving, on the basis of information of the electron beam irradiation quantity detector, a pair of second deflection electrodes for deflecting the electron beam in a radial direction of the master, it is possible to restrain the variations of the track pitch recorded on the master.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

FIRST EMBODIMENT

Figure 1:
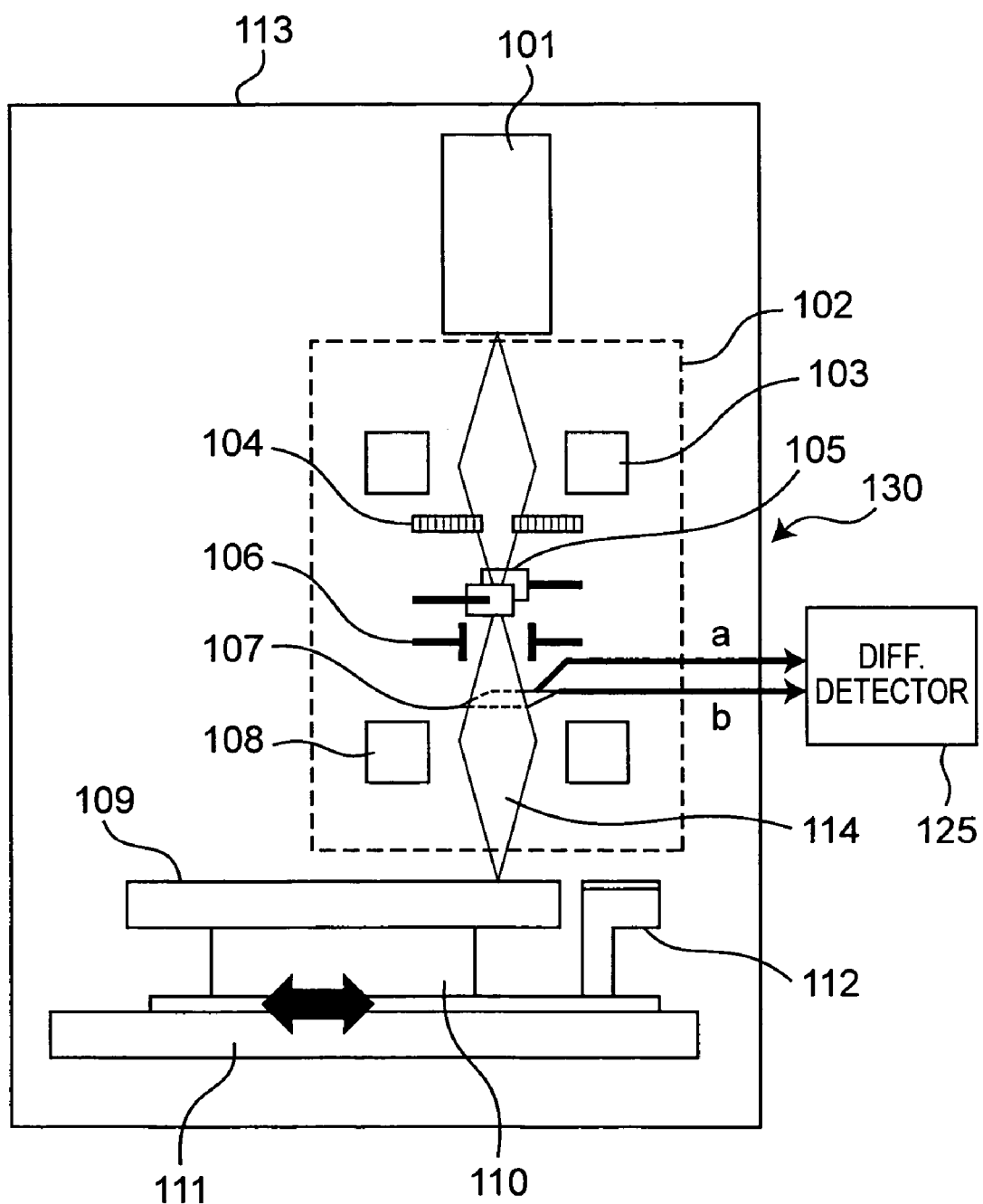
FIG. 1 is a schematic sectional view of an electron beam recorder according to a first embodiment of the present invention.

FIG. 1 shows an arrangement of an electron beam recorder for recording signals on a master 109 of an information recording medium, for example, an optical disc by using an electron beam 114, according to a first embodiment of the present invention. This electron beam recorder has a following structural portion similar to that of a conventional electron beam of FIG. 7. Namely, this electron beam recorder includes an electron beam source 101 for generating the electron beam 114 and an electron optical system 102 which converges the emitted electron beam 114 onto the resist master 109 so as to record information patterns on the resist master 109 in accordance with inputted information signals. The electron beam source 101 and the electron optical system 102 are accommodated in a vacuum chamber 113.

The electron beam source 101 is constituted by a filament for emitting electrons upon flow of electric current therethrough, an electrode for suppressing the emitted electrons, an electrode for extracting and accelerating the electron beam 114, etc. and is adapted to emit the electrons from one point.

Meanwhile, the electron optical system 102 includes a lens 103 for converging the electron beam 114, an aperture 104 for determining a beam diameter of the electron beam 114, a pair of first deflection electrodes 105 and a pair of second deflection electrodes 106 which deflect the electron beam 114 in orthogonal directions, respectively in accordance with the inputted information signals, a shielding plate 107 for shielding the electron beam 114 bent by the first deflection electrodes 105 and a lens 108 for converging the electron beam 114 onto a surface of the resist master 109. A pair of the first deflection electrodes 105 deflect the electron beam 114 to the shielding plate 107 so as to act as a shielding deflector, while a pair of the second deflection electrodes 106 deflect the electron beam 114 for its irradiation position correction as described later so as to act as an irradiation position correcting deflector.

Furthermore, the resist master 109 is held on a rotary stage 110 and is moved horizontally together with the rotary stage 110 in the direction of the arrow by a horizontally traveling stage 111. If the master 109 is moved horizontally by the horizontally traveling stage 110 while being rotated by the rotary stage 110, the electron beam 114 can be irradiated spirally on the master 109 so as to spirally record the information signals of the optical disc on the master 109.

Moreover, a focusing grid 112 is disposed substantially flush with the surface of the master 109. This focusing grid 112 is provided for adjusting a focal position of the lens 108 such that the lens 108 converges the electron beam 114 onto the surface of the master 109. If electrons reflected by the focusing grid 112 or secondary electrons emitted from the focusing grid 112 upon irradiation of the electron beam 114 on the focusing grid 112 are detected by a detector such that a grid image is monitored, the focal position of the lens 108 can be adjusted from a state in which the grid image is seen. The members 109-112 referred to above are also accommodated in the vacuum chamber 113.

Figure 2:
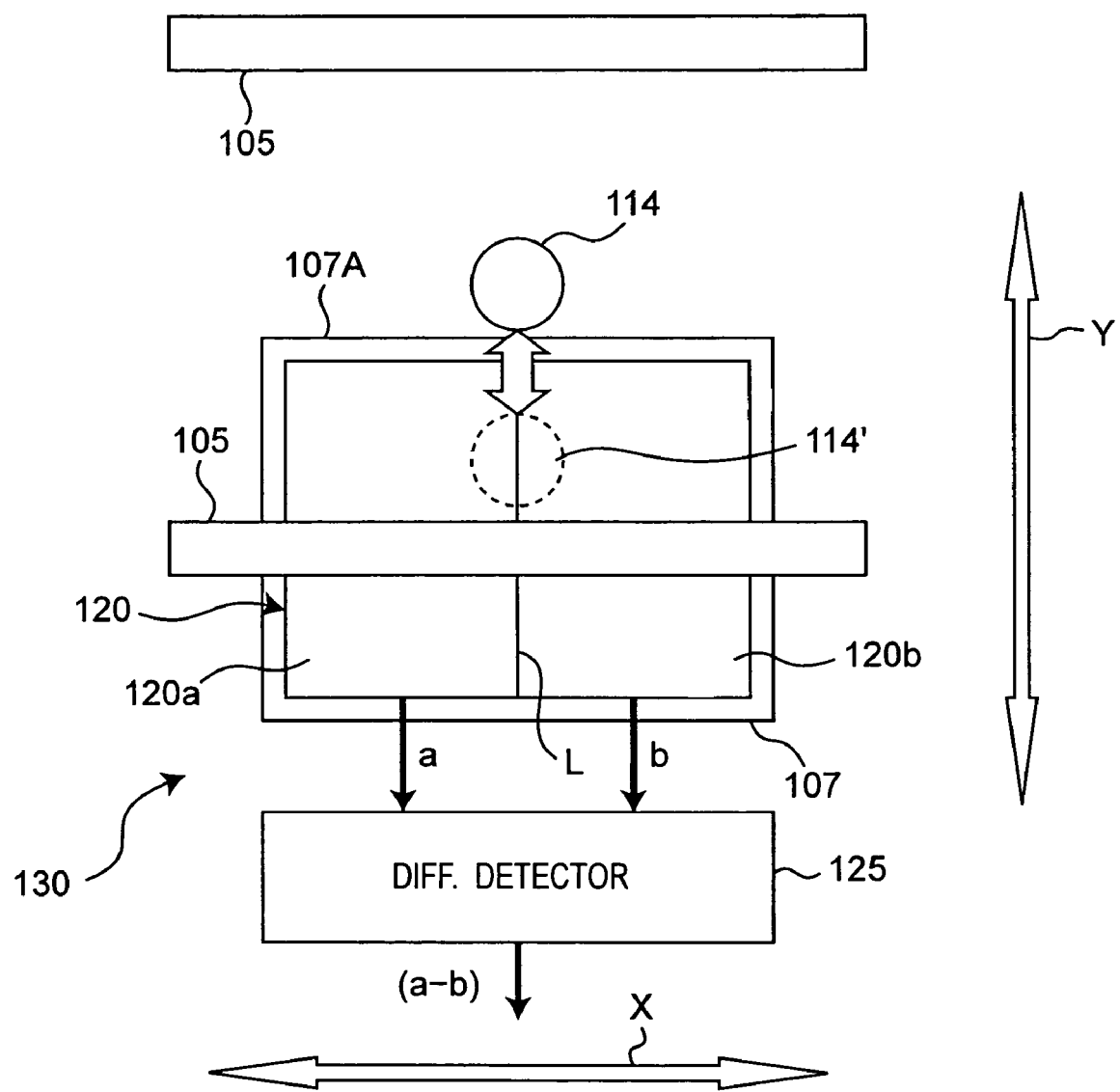
FIG. 2 is a mimetic top plan view showing an arrangement of an electron beam irradiation position detecting unit of the electron beam recorder of FIG. 1.
Figure 7:
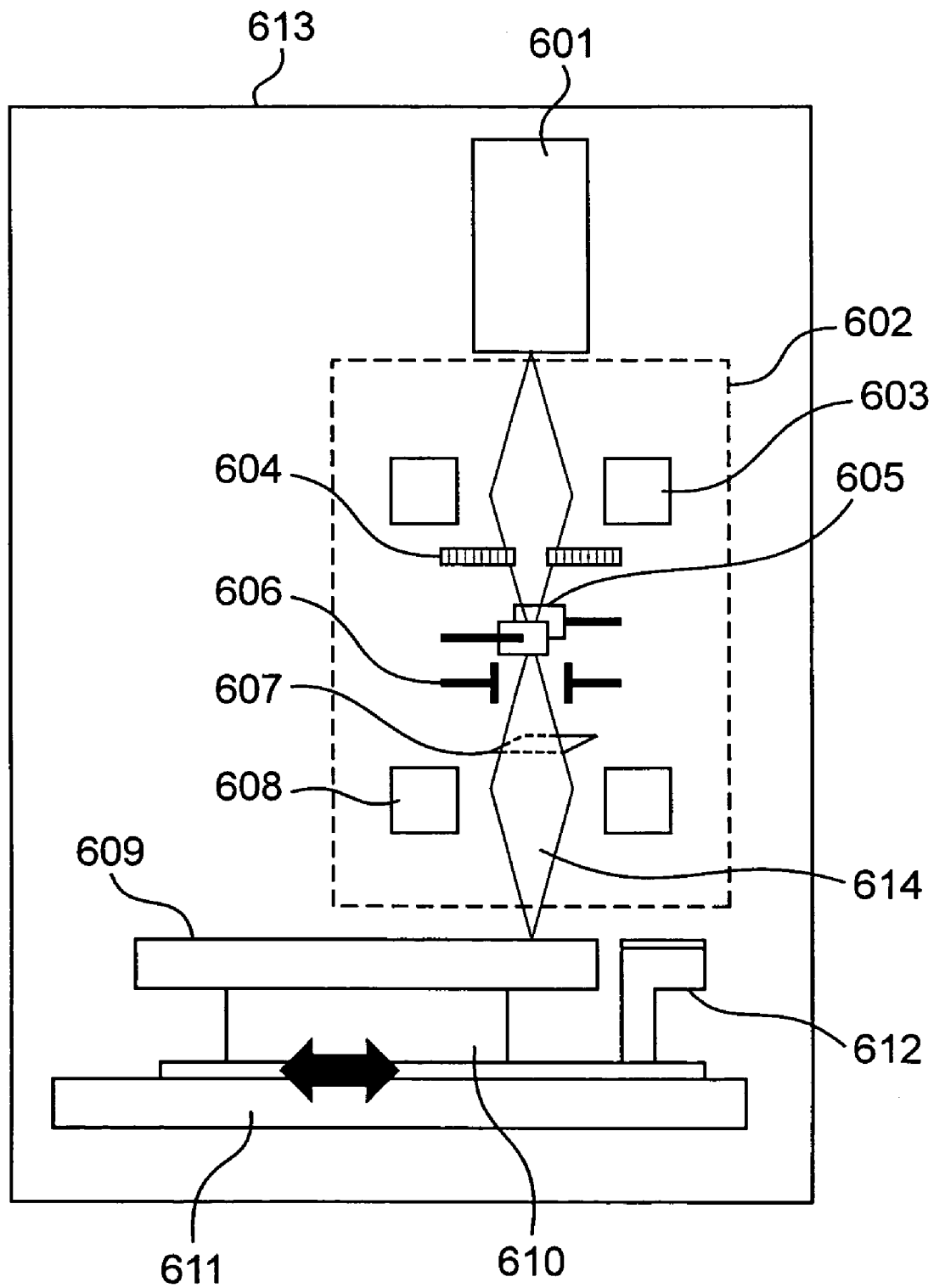
FIG. 7 is a schematic sectional view showing one example of a prior art electron beam recorder.

In addition to the above mentioned structural portion similar to that of the conventional electron beam recorder of FIG. 7, the electron beam recorder of the present invention includes an electron beam irradiation position detecting unit 130. The electron beam irradiation position detecting unit 130 is provided so as to detect a position of the electron beam 114 passing therethrough. FIG. 2 is a top plan view of the electron beam irradiation position detecting unit 130. As shown in FIG. 2, the electron beam irradiation position detecting unit 130 includes the first deflection electrodes 105, the shielding plate 107, an electron beam irradiation quantity detector 120 having first and second electron beam detecting portions 120a and 120b provided on the shielding plate 107 and a difference detector 125 connected to the electron beam irradiation quantity detector 120. As described in detail below, an output signal a of the first electron beam detecting portion 120a and an output signal b of the second electron beam detecting portion 120b are inputted to the difference detector 125 such that a difference signal (a−b) between the signals a and b is outputted from the difference detector 125.

In FIG. 2, the shielding plate 107 is provided such that an edge 107A of the shielding plate 107 substantially comes into contact with the electron beam 114 passing through a substantially central point between the first deflection electrodes 105. Meanwhile, a boundary line L between the first and second electron beam detecting portions 120a and 120b of the electron beam irradiation quantity detector 120 is substantially parallel to an information recording direction Y on the master 109 and is disposed so as to be aligned with a center of the electron beam 114. The information recording direction Y on the master 109 is substantially perpendicular to a radial direction X of the master 109.

In case the information signals such as pits are recorded on the master 109, a voltage corresponding to the information signals to be recorded is applied to the first deflection electrodes 105 so as to deflect the electron beam 114 to a position 114'. When the electron beam 114 is irradiated on the master 109, no voltage is applied to the first deflection electrodes 105. On the other hand, when the electron beam 114 is not irradiated on the master 109, the voltage is applied to the first deflection electrode 105 so as to deflect the electron beam 114 to the position 114'. At this time, the deflected electron beam 114' is shielded by the shielding plate 107 and thus, is prevented from being irradiated on the master 109. By repeating these procedures, the patterns are recorded on the master 109.

When the electron beam 114' is shielded by the shielding plate 107, the electron beam 114' is irradiated on both of the first and second electron beam detecting portions 120a and 120b and the signals a and b corresponding to irradiation quantities of the electron beam 114' are, respectively, outputted from the first and second electron beam detecting portions 120a and 120b. The output signals a and b of the first and second electron beam detecting portions 120a and 120b are inputted to the difference detector 125 such that the difference signal (a−b) is outputted from the difference detector 125.

In case the electron beam 114 is not subjected to positional variations due to disturbances, etc., a locus of the electron beam 114 deflected by the first deflection electrodes 105 lies on the boundary line L of the first and second electron beam detecting portions 120a and 120b. However, when the electron beam 114 has been displaced by variations of ambient magnetic field or mechanical vibrations and electrical noises of the electron beam recorder, the locus of the electron beam 114 deflected by the first deflection electrodes 105 deviates from the boundary line L of the first and second electron beam detecting portions 120a and 120b.

Figure 3A:
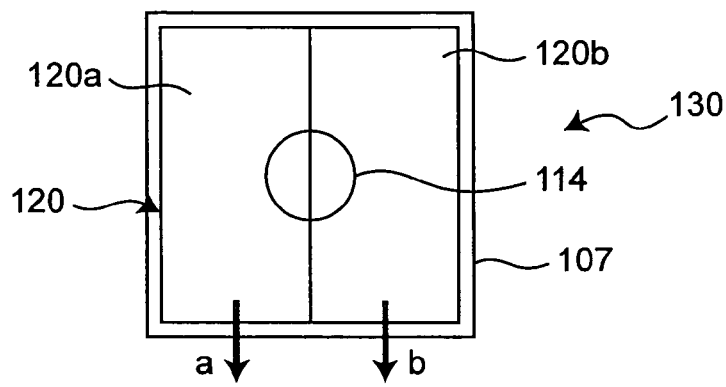
FIGS. 3A, 3B and 3C are top plan views showing a normal position and deflection of an electron beam on a shielding plate of the electron beam irradiation position detecting unit of FIG. 2.
Figure 3B:
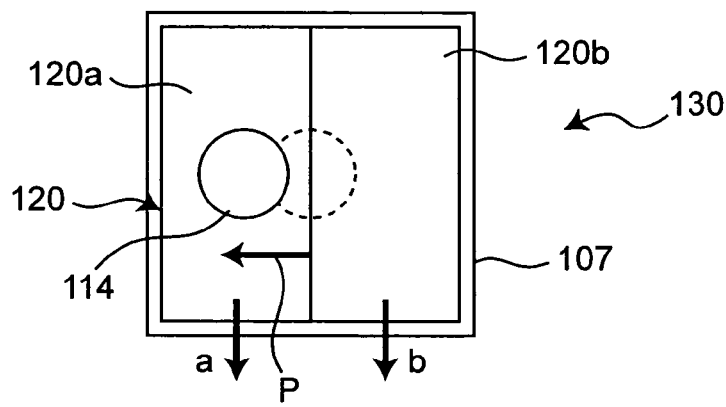
Figure 3C:
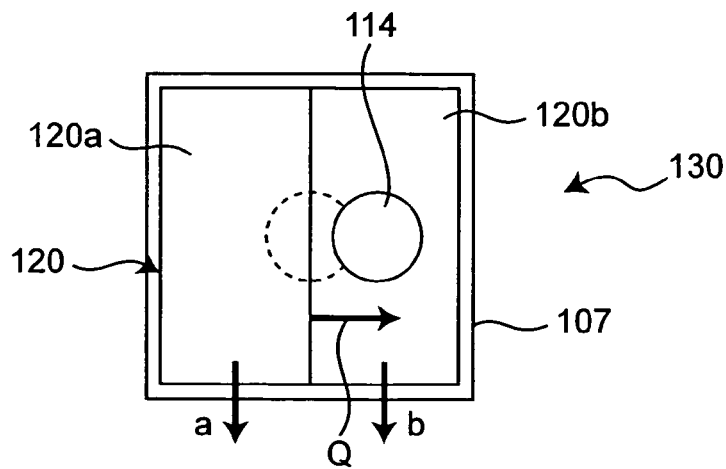

FIGS. 3A, 3B and 3C show motions of the electron beam 114 on the shielding plate 107 of the electron beam irradiation position detecting unit 130. In case the electron beam 114 is not displaced by disturbances, etc., the electron beam 114 deflected by the first deflection electrodes 105 is irradiated on the shielding plate 107 at a position shown in FIG. 3A. However, when the electron beam 114 has been displaced in the radial direction X of the master 109 by the such disturbances as variations of magnetic field, the electron beam 114 moves on the shielding plate 107 in the direction of the arrow P as shown in FIG. 3B or in the direction of the arrow Q as shown in FIG. 3C. The signals a and b corresponding to quantities of the electron beam 114 irradiated on the first and second electron beam detecting portions 120a and 120b are, respectively, outputted from the first and second electron beam detecting portions 120a and 120b. Meanwhile, the first and second electron beam detecting portions 120a and 12b are so adjusted as to have a substantially identical detection sensitivity. This detection sensitivity adjustment is performed such that when the electron beam 114 has been wholly irradiated on each of the first and second electron beam detecting portions 120a and 120b by displacing the electron beam 114, the signals a and b outputted from the first and second electron beam detecting portions 120a and 120b assume a substantially identical value. The signals a and b outputted from the first and second electron beam detecting portions 120a and 120b are inputted to the difference detector 125 in which a difference (a−b) is calculated.

Figure 4:
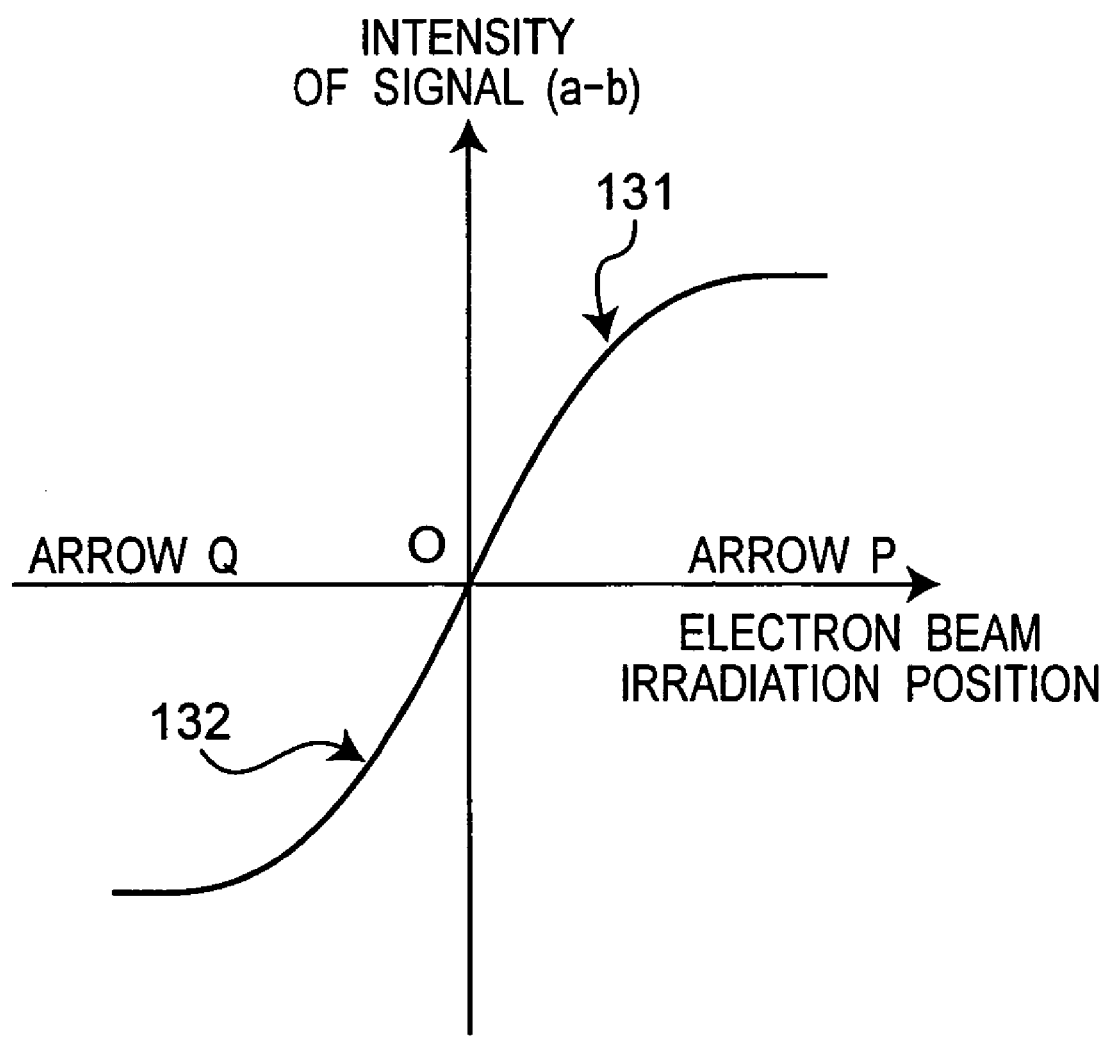
FIG. 4 is a graph showing relation between electron beam irradiation position and output of a difference detector in the electron beam recorder of FIG. 1.

FIG. 4 shows change of intensity of the output signal (a−b) of the difference detector 125 relative to variations of irradiation position of the electron beam 114 shown in FIGS. 3A to 3C. For example, in case the electron beam 114 has been deflected normally without being displaced by disturbances, the electron beam 114 is irradiated at the position shown in FIG. 3A. At this time, the output signal a of the first electron beam detecting portion 120a and the output signal b of the second electron beam detecting portion 120b become substantially identical with each other, so that the intensity of the output signal (a−b) of the difference detector 125 assumes zero substantially as shown by an origin O in FIG. 4. On the other hand, in case the electron beam 114 has been displaced from the normal position of FIG. 3A towards the first electron beam detecting portion 120a in the direction of arrow P as shown in FIG. 3B, the intensity of the output signal (a−b) of the difference detector 125 shifts to a curve 131 in a plus domain of FIG. 4. On the contrary, in case the electron beam 114 has been displaced from the normal position of FIG. 3A towards the second electron beam detecting portion 120b in the direction of the arrow Q as shown in FIG. 3C, the intensity of the output signal (a−b) of the difference detector 125 shifts to a curve 132 in a minus domain of FIG. 4. Therefore, in the electron beam irradiation position detecting unit 130, position of the electron beam 114 can be detected from the value of the output signal (a−b) of the difference detector 125.

Since the electron beam 114 is deflected in accordance with the information signals by the first deflection electrodes 105, there can be moments in which the electron beam 114 is irradiated on the shielding plate 107 and other moments in which the electron beam 114 is not irradiated on the shielding plate 107. In the electron beam detector according to the first embodiment of the present invention, positional variations of the electron beam 114 can be detected only during the moments in which the electron beam 114 is irradiated on the shielding plate 107 upon its deflection by the first deflection electrodes 105. Thus, it is impossible to detect the positional variations of the electron beam 114 during moments in which the electron beam 114 is irradiated on the master 109. However, actually, even the moments in which the electron beam 114 is irradiated on the master 109, namely, the electron beam 114 is not irradiated on the shielding plate 107 may not prove a hindrance to detection of the positional variations of the electron beam 114 for the following reason. The disturbances causing the positional variations of the electron beam 114 are mainly composed of ambient electrical noises of the electron beam recorder, especially, vibrations at a supply frequency of about several Hz to several tens Hz, mild variations of magnetic field or mechanical vibrations at a frequency of about several hundreds Hz to several kHz. On the other hand, modulation rate based on the information signals is quite high. For example, in a high-density optical disc in which recording is performed by using an electron beam, the modulation rate is determined by a rate for performing recording on the master, size of the pits recorded on the master, etc. but is extremely high so as to range from several MHz to several hundreds MHz. To cite one example, when recording is performed at a recording linear speed of 2 m/s. on a next-generation optical disc for recording pit patterns having a pit length of 149 nm, its modulation rate is about 7 MHz. Meanwhile, when recording is performed at a recording linear speed of 5 m/s. on the next-generation optical disc, its modulation rate is about 17 MHz. If a low-pass filter for attenuating a high-range frequency of the output signals a and b of the first and second electron beam detecting portions 120a and 120b or the output signal (a−b) of the difference detector 125 or the like is provided so as to limit a response speed of the signals a and b or the signal (a−b) to several kHz, the information signals are complemented even during the moments in which the electron beams 114 are not irradiated on the shielding plate 107 in response to the information signals, so that the positional variations of the electron beam 114 can be detected.

By employing the above mentioned arrangement of the electron beam recorder of the present invention, the positional variations of the electron beam 114 in the radial direction X of the master 109 can be detected while the information signals are being recorded on the master 109 by irradiating the electron beam 114 on the master 109. As a result, since variations of a track pitch of the signals recorded on the master 109 of the optical disc can be monitored, it is possible to judge during recording on the master 109 whether or not the track pitch of the signals recorded on the master 109 falls within a permissible range. To this end, for example, the electron beam 114 is initially displaced through a large distance in the radial direction X of the master 109, i.e., in a feed direction of the horizontally traveling stage 111 by using the second deflection electrodes 106 capable of deflecting the electron beam 114 in the radial direction X of the master 109, i.e., in a direction substantially perpendicular to the information recording direction Y on the master 109 and then, a sample is recorded on a test master or the like by checking the output of the difference detector 125. By inspecting variations of a track pitch of the recorded sample with an electron microscope, etc., interrelationship between change amount of electron beam irradiation position on the master 109 and the output signal of the difference detector 125 is grasped beforehand. Here, the electron beam 114 is preliminarily displaced greatly such that the change amount of electron beam irradiation position on the master 109 can be easily measured from shape of the recorded sample with the electron microscope, etc. Thereafter, when recording is performed on the master 109, variations of a track pitch can be detected directly from the output signal of the difference detector 125.

If it is specified that a track pitch of information pits recorded on the master 109 is 320 nm and variations of a track pitch of the optical disc should fall within a permissible range of (±5 nm), the output signal of the difference detector 125 can be beforehand converted from the recording result of the test master when the variations of the track pitch of the optical disc fall within the permissible range of (±5 nm). Hence, if the output signal of the difference detector 125 is monitored continuously at the time recording is being actually performed on the master 109, it is possible to estimate whether or not variations of the track pitch of the master 109 fall within the permissible range.

Figure 5:
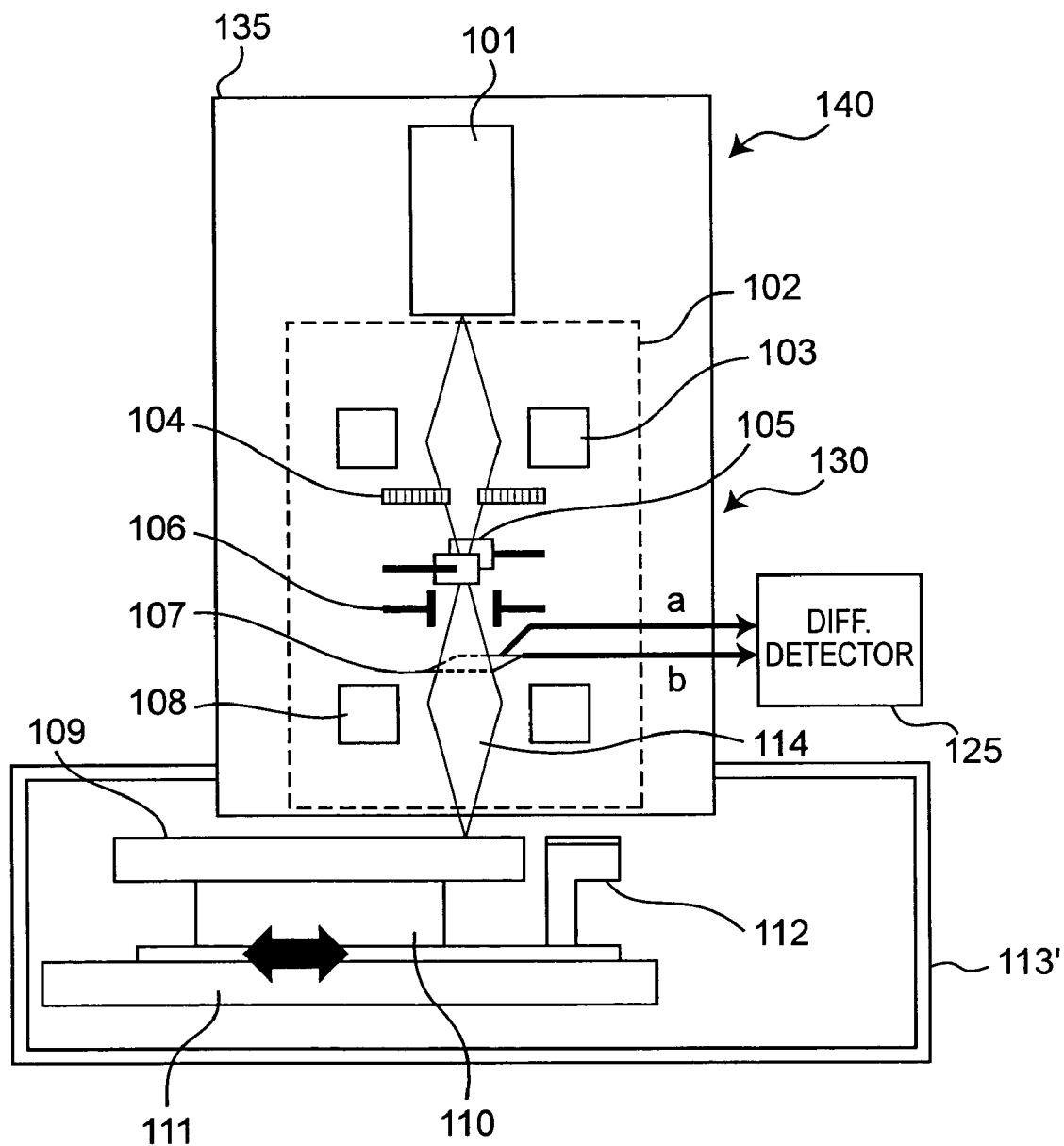
FIG. 5 is a schematic sectional view of an electron beam recorder which is a modification of the electron beam recorder of FIG. 1.

FIG. 5 shows an arrangement of an electron beam recorder which is a modification of the electron beam recorder of FIG. 1. This modified electron beam recorder includes an electron beam column 140 and a vacuum chamber 113' such that a casing 135 of the electron beam column 140 is hermetically fitted into a bore of the vacuum chamber 113'. Meanwhile, the electron beam source 101 and the electron optical system 102 are accommodated in the casing 135 of the electron beam column 140, while the master 109, the rotary stage 110, the horizontally traveling stage 111 and the focusing grid 112 are accommodated in the vacuum chamber 113'.

In the first embodiment of the present invention, the shielding plate 107 is provided above the lens 108 in the electron optical system 102 but may be provided at another location. Especially, in order to more accurately detect variations of position of the electron beam 114 irradiated on the master 109, it is preferable that the shielding plate 107 should be disposed at a location as close to the master 109 as possible.

SECOND EMBODIMENT

Figure 6:
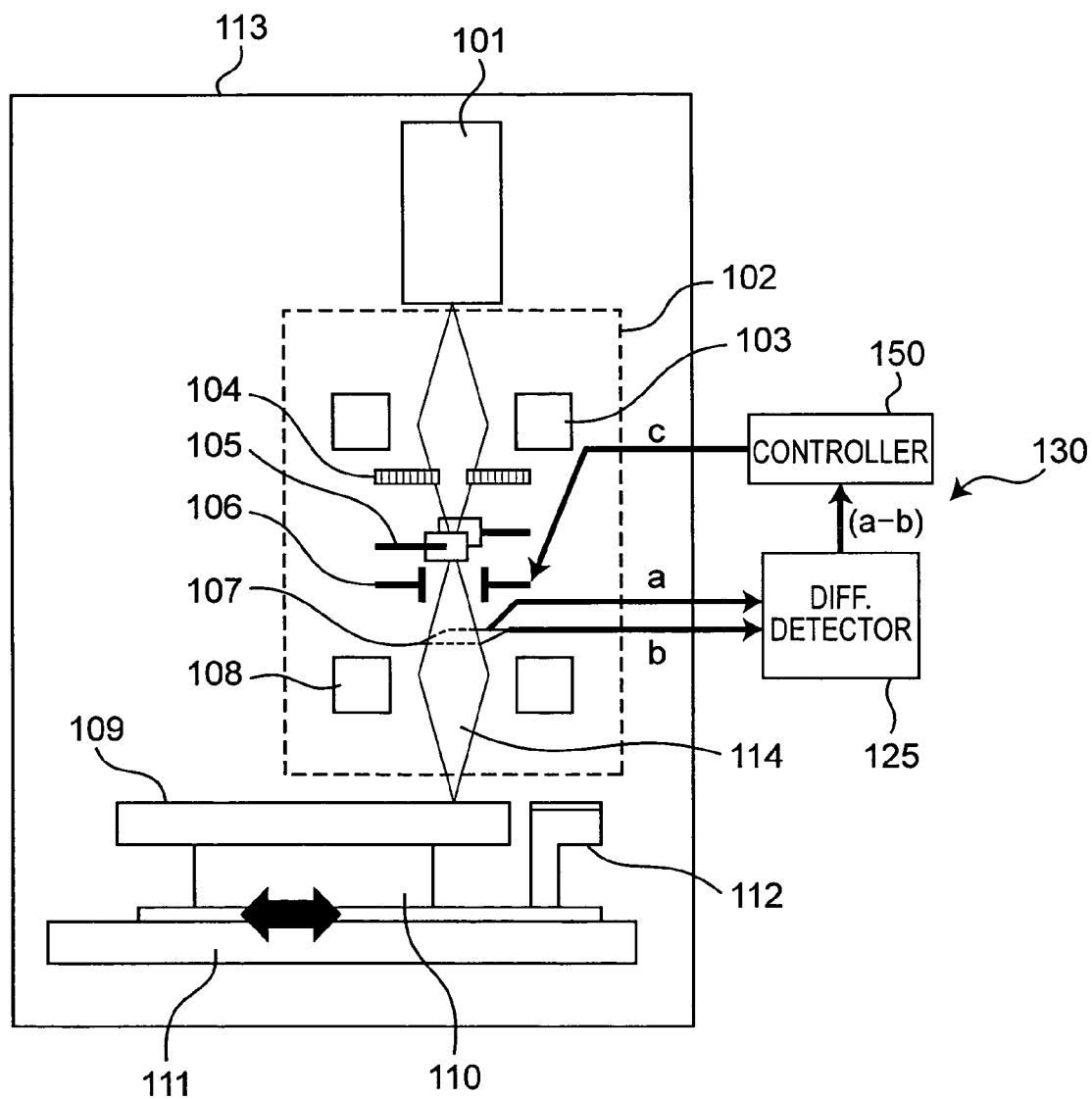
FIG. 6 is a schematic sectional view of an electron beam recorder according to a second embodiment of the present invention.

FIG. 6 shows an arrangement of an electron beam recorder according to a second embodiment of the present invention. This electron beam recorder includes an electron beam irradiation position controller 150 connected between the difference detector 125 of the electron beam irradiation position detecting unit 130 and the second deflection electrodes 106. Since other constructions of the electron beam recorder are similar to those of the electron beam recorder of the first embodiment, the description is abbreviated for the sake of brevity.

In this arrangement of the electron beam recorder of FIG. 6, since variations of detected electron beam irradiation position are restrained by the electron beam irradiation position controller 150, nonuniformity of a track pitch of patterns recorded on the master 109 can be lessened. In case there is no variation of irradiation position, the difference detector 125 outputs, as the output signal (a−b), a zero signal corresponding to the origin O in FIG. 4. Meanwhile, in case the electron beam 114 has been displaced towards the first electron beam detecting portion 120a and, on the contrary, towards the second electron beam detecting portion 120b, the difference detector 125 outputs, as the output signal (a−b), a plus signal corresponding to the curve 131 and a minus signal corresponding to the curve 132, respectively as shown in FIG. 4.

This output signal (a−b) of the difference detector 125 is inputted to the electron beam irradiation position controller 150 and the electron beam irradiation position controller 150 produces an irradiation position correcting signal c through predetermined signal amplification or attenuation and phase adjustment so as to feed this irradiation position correcting signal c back to the second deflection electrodes 106. Since the second deflection electrodes 106 can deflect the electron beam 114 in the substantially same direction as the travel direction of the horizontally traveling stage 111, i.e., in the radial direction X of the master 109 in accordance with the irradiation position correcting signal c inputted to the second deflection electrodes 106, irradiation position of the electron beam 114 can be stabilized by bending, in response to the output signal (a−b) of the difference detector 125, the electron beam 114 in a direction for reducing positional variations of the electron beam 114. By this arrangement of the electron beam recorder of FIG. 6, it becomes possible to correct variations of the track pitch of the optical disc, which track pitch is recorded on the master 109.

The electron beam recorder, the electron beam irradiation position detecting method and the electron beam irradiation position controlling method of the present invention are useful for highly accurately recording the signals on the master of the information recording medium such as the optical disc and can be utilized for raising accuracy of the track pitch of the information recording medium.

What is claimed is:

1. An electron beam recorder comprising:
    an electron optical system for irradiating the electron beam on a master of an information recording medium;
    a shielding plate for shielding the electron beam;
    an electron beam irradiation quantity detector which is provided on the shielding plate and is divided into first and second electron beam detecting portions along an information recording direction on the master; and
    a difference detector for calculating a difference between a first quantity of the electron beam irradiated on the first electron beam detecting portion and a second quantity of the electron beam irradiated on the second electron beam detecting portion such that a position of the electron beam in a direction substantially perpendicular to the information recording direction is detected from the difference.

2. The electron beam recorder as claimed in claim 1, further comprising:
    an irradiation position correcting deflector for deflecting the electron beam for its irradiation position correction in the direction substantially perpendicular to the information recording direction; and
    an electron beam irradiation position controller for producing an irradiation position correcting signal on the basis of the position of the electron beam so as to input the irradiation position correcting signal to the irradiation position correcting deflector such that the deflection beam is deflected in the direction substantially perpendicular to the information recording direction in accordance with the irradiation position correcting signal by the irradiation position correcting deflector.

3. The electron beam recorder as claimed in claim 1, further comprising:
    a shielding deflector for deflecting the electron beam to the shielding plate in a direction substantially parallel to the information recording direction;
    wherein the electron beam is irradiated on the shielding plate by the shielding deflector so as to be shielded by the shielding plate.

4. The electron beam recorder as claimed in claim 2, further comprising:
    a shielding deflector for deflecting the electron beam to the shielding plate in a direction substantially parallel to the information recording direction;
    wherein the electron beam is irradiated on the shielding plate by the shielding deflector so as to be shielded by the shielding plate.

5. The electron beam recorder as claimed in claim 2, wherein the irradiation position correcting deflector is formed by a pair of deflection electrodes.

6. The electron beam recorder as claimed 3, wherein the shielding deflector is formed by a pair of deflection electrodes.

7. An electron beam shielding plate for shielding an electron beam emitted from an electron beam source and subjected to deflection so as to perform intensity modulation of the electron beam, which has an electron beam detecting region divided into at least two portions along a straight line substantially parallel to a direction of the deflection of the electron beam.

8. An electron beam column which includes a shielding plate for shielding an electron beam emitted from an electron beam source and subjected to deflection so as to perform intensity modulation of the electron beam,
    wherein the shielding plate has an electron beam detecting region divided into at least two portions along a straight line substantially parallel to a direction of the deflection of the electron beam such that a center of the electron beam proceeds along the straight line during the deflection.

9. A method of detecting an irradiation position of an electron beam in an electron beam recorder including an electron optical system for irradiating the electron beam on a master of an information recording medium, a shielding deflector for deflecting the electron beam for its shielding, a shielding plate for shielding the electron beam deflected by the shielding deflector and an electron beam irradiation quantity detector provided on the shielding plate and divided into first and second electron beam detecting portions along an information recording direction on the master, the method comprising the steps of:
    irradiating the electron beam on the master;
    deflecting the electron beam by the shielding deflector;
    shielding by the shielding plate the electron beam deflected by the shielding deflector;
    detecting a first quantity of the electron beam irradiated on the first electron beam detecting portion and a second quantity of the electron beam irradiated on the second electron beam detecting portion;
    obtaining a difference between the first quantity and the second quantity; and
    determining from the difference a position of the electron beam in a direction substantially perpendicular to the information recording direction.

10. The method as claimed in claim 9, wherein the shielding deflector deflects the electron beam in a direction substantially parallel to the information recording direction.

11. The method as claimed in claim 9, wherein the shielding deflector is formed by a pair of deflection electrodes.

12. A method of producing the information recording medium by employing the master manufactured by the steps of the method of claim 9.

13. A method of producing the information recording medium by employing the master manufactured by the steps of the method of claim 10.

14. A method of producing the information recording medium by employing the master manufactured by the steps of the method of claim 11.

* * * * *

UNITED STATES PATENT AND TRADEMARK OFFICE
CERTIFICATE OF CORRECTION

PATENT NO. : 7,474,604 B2  
APPLICATION NO. : 11/076787  
DATED : January 6, 2009  
INVENTOR(S) : Masahiko Tsukuda et al.

Page 1 of 1

It is certified that error appears in the above-identified patent and that said Letters Patent is hereby corrected as shown below:

On the Cover Page, FIELD [*], Notice:
should read --This patent is subject to a terminal disclaimer.--

Signed and Sealed this

Second Day of June, 2009

JOHN DOLL
*Acting Director of the United States Patent and Trademark Office*